(12) United States Patent
Hayes

(10) Patent No.: US 7,943,845 B2
(45) Date of Patent: May 17, 2011

(54) SOLAR CELLS ENCAPSULATED WITH POLY(VINYL BUTYRAL)

(75) Inventor: Richard Allen Hayes, Beaumont, TX (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 765 days.

(21) Appl. No.: 11/704,013

(22) Filed: Feb. 7, 2007

(65) Prior Publication Data

US 2008/0185035 A1 Aug. 7, 2008

(51) Int. Cl.
*H01L 31/0203* (2006.01)
*H01L 31/048* (2006.01)

(52) U.S. Cl. ........ 136/251; 136/259; 136/244; 136/252; 524/557; 438/64

(58) Field of Classification Search .................. 136/251; 427/160–169; 525/50
See application file for complete search history.

(56) References Cited

U.S. PATENT DOCUMENTS

| | | | |
|---|---|---|---|
| 3,957,537 A | 5/1976 | Baskett et al. | |
| 4,067,764 A | 1/1978 | Walker et al. | |
| 4,130,684 A | 12/1978 | Littell, Jr. et al. | |
| 4,249,958 A | 2/1981 | Baudin et al. | |
| 4,321,418 A | 3/1982 | Dran et al. | |
| 4,504,341 A | 3/1985 | Radzwill et al. | |
| 4,874,814 A * | 10/1989 | Cartier et al. ................... | 525/61 |
| 4,960,631 A | 10/1990 | Walters et al. | |
| 5,137,954 A | 8/1992 | DasGupta et al. | |
| 5,187,217 A | 2/1993 | Degeilh et al. | |
| 5,270,518 A | 12/1993 | Naoumenko et al. | |
| 5,508,205 A | 4/1996 | Dominguez et al. | |
| 5,582,653 A | 12/1996 | Kataoka et al. | |
| 5,728,230 A | 3/1998 | Komori et al. | |
| 6,075,202 A | 6/2000 | Mori et al. | |
| 6,114,046 A * | 9/2000 | Hanoka ......................... | 428/515 |
| 6,288,323 B1 | 9/2001 | Hayashi et al. | |
| 6,288,326 B1 | 9/2001 | Hayashi et al. | |

(Continued)

FOREIGN PATENT DOCUMENTS

EP 0 145 928 B1 6/1985

(Continued)

OTHER PUBLICATIONS

Dhaliwal et al., the Characterization of Polyvinyl Butyral by Thermal Analysis, Thermochimica Acta, vol. 391, pp. 245-255, 2002.*

(Continued)

*Primary Examiner* — Jennifer K. Michener
*Assistant Examiner* — Jayne Mershon

(57) ABSTRACT

A solar cell pre-laminate assembly comprising (i) a solar cell component comprising one or a plurality of solar cells and having a light-receiving side and a back side, and (ii) stiff poly(vinyl butyral) sheet as an encapsulant layer, wherein the stiff poly(vinyl butyral) sheet is positioned next to the light-receiving or the back side of the solar cell component and comprises a poly(vinyl butyral) composition containing about 10 to about 23 wt % of a plasticizer based on the total weight of the composition.

A process of preparing solar cell assembly comprising (i) providing a solar cell component and a stiff poly(vinyl butyral) sheet comprising a poly(vinyl butyral) composition containing about 10 to about 23 wt % of a plasticizer based on the total weight of the poly(vinyl butyral) composition, and (ii) encapsulating the solar cell component in a polymer matrix comprising the poly(vinyl butyral) composition.

29 Claims, 1 Drawing Sheet

U.S. PATENT DOCUMENTS

| | | |
|---|---|---|
| 6,538,192 B1 | 3/2003 | Coster et al. |
| 6,693,237 B2 | 2/2004 | Yamada et al. |
| 6,777,610 B2 | 8/2004 | Yamada et al. |
| 6,822,157 B2 | 11/2004 | Fujioka |
| 6,940,008 B2 | 9/2005 | Shiotsuka et al. |
| 2004/0191422 A1 | 9/2004 | Kataoka et al. |
| 2005/0192398 A1 | 9/2005 | Wong et al. |
| 2005/0274410 A1* | 12/2005 | Yuuki et al. .................. 136/251 |
| 2005/0284516 A1 | 12/2005 | Koll |
| 2007/0224340 A1* | 9/2007 | Hatta et al. .................. 427/160 |

FOREIGN PATENT DOCUMENTS

| | | |
|---|---|---|
| EP | 0 343 628 B1 | 11/1989 |
| EP | 0 631 328 B1 | 12/1994 |
| EP | 1 005 096 A2 | 5/2000 |
| EP | 1 054 456 A2 | 11/2000 |
| EP | 1722619 A1 | 11/2006 |
| WO | WO 03/078160 A1 | 9/2003 |

OTHER PUBLICATIONS

Rak, et al., Porous titanium foil by tape casting technique, Journal of Materials Processing Technology, Jun. 1, 2006, 358-363, vol. 175, No. 1-3, Elsevier, Amsterdam, NL.

PCT International Search Report and Written Opinion for International application No. PCT/US2008/001751, dated May 14, 2008.

U.S. Appl. No. 11/833,256 filed Dec. 4, 2008, Inventor Hayes.

* cited by examiner

SOLAR CELLS ENCAPSULATED WITH POLY(VINYL BUTYRAL)

FIELD OF THE INVENTION

The present invention relates to solar cell modules comprising encapsulated solar cell components and methods of producing the same.

BACKGROUND OF THE INVENTION

Plasticized poly(vinyl butyral) sheets developed for glazings can generally fall into one of three categories based on the level of plasticizer contained in the composition, i.e., automobile, stiff, and acoustic poly(vinyl butyral). Automobile poly(vinyl butyral) sheets, such as those used as automobile windshields, are generally derived from poly(vinyl butyral) compositions containing greater than about 25 wt % of plasticizer. Stiff poly(vinyl butyral) sheets, such as those used as aircraft windshields, are generally derived from poly(vinyl butyral) compositions containing about 17 to about 23 wt % of plasticizer. Acoustic poly(vinyl butyral) sheets, such as those used as sound barrier layers in architectural and automobile glazings, are generally derived from poly(vinyl butyral) containing greater than about 45 wt % of plasticizer. The different amounts of plasticizer contained in these different types of poly(vinyl butyral) compositions provide the glazing interlayers derived therefrom with desirable penetration resistance at the temperature they are used. Thus, stiff poly(vinyl butyral) sheets, with a relatively low level of plasticizer, has optimum penetration resistance at high temperatures, while automobile poly(vinyl butyral) sheets, with a higher level of plasticizer, has optimum penetration resistance at lower temperatures.

Stiff poly(vinyl butyral) sheets have been disclosed in U.S. Pat. Nos. 4,130,684; 4,504,341; 4,960,631; and 5,270,518. In addition, Wong, et. al., in US-2005-0192398 A1, disclose a process to produce certain low color, stiff poly(vinyl butyral) sheets. The use of poly(vinyl butyral) compositions with low level of plasticizers has not been limited to glazing interlayers. For example, Degeilh, et. al., in U.S. Pat. No. 5,187,217, disclose a poly(vinyl butyral) composition with 16-20 wt % of plasticizer for gluing a base onto a glazing, such as a rearview mirror onto an automotive windshield.

Poly(vinyl butyral) compositions with low levels of plasticizer have also been disclosed for use in solar cell laminates. For example, Dran, et. al., in U.S. Pat. No. 4,321,418, disclose a process for producing a solar cell module, which involves the step of embedding interconnected solar cells between two (2) 5-mm-thick (197-mils-thick) layers of a mixture of 100 parts by weight of poly(vinyl butyral) resin powder and 20 parts by weight of powdered plasticizer made up of triethylene glycol di-(ethyl-2-butyrate). However, it is noted that the 5 mm thickness of the poly(vinyl butyral) resin composition could impair the efficiency of light transmission. Further, the process to produce such solar cell laminates is overly complicated for use in commercial settings.

As a renewable energy resource, the use of solar cell modules is rapidly expanding. With increasingly complex solar cell modules or laminates, also referred to as photovoltaic modules, comes an increased demand for enhanced functional encapsulant materials. Photovoltaic (solar) cell modules or laminates are units that convert light energy into electrical energy.

One typical or conventional construction of a solar cell laminate consists of voltage-generating component (or solar cell component) encapsulated by a polymer, such as poly(vinyl butyral) (PVB), with an incident layer (e.g., glass) and backing layer or back-sheet.

Plasticized poly(vinyl butyral) compositions have been disclosed as materials to form solar cell encapsulant layers. See, e.g., U.S. Pat. Nos. 3,957,537; 4,249,958; 4,321,418; 5,508,205; 5,582,653; 5,728,230; 6,075,202; 6,288,323; 6,288,326; 6,538,192; 6,777,610; 6,822,157; 6,940,008, US 2004-0191422, US 2005-0284516; EP 0 343 628; EP 0 631 328; EP 1 005 096; and EP 1 054 456. In these applications, the plasticized poly(vinyl butyral) compositions are mainly used as hot melt adhesives to encapsulate and protect the solar cells.

One preferred way of manufacturing a solar cell modules involves forming a pre-laminate comprising at least 5 structural layers. The solar cell pre-laminates are typically constructed in the following order starting from the top, or incident layer (that is, the layer first contacted by light) and continuing to the backing (the layer furthest removed from the incident layer): (1) incident layer (typically a glass plate or a thin polymeric film (such as a fluoropolymer or polyester film), but could conceivably be any material that is transparent to sunlight), (2) front-sheet (or first) encapsulant layer, (3) voltage-generating component (or solar cell component), (4) second encapsulant layer, and (5) backing layer or back-sheet.

The encapsulant layers of solar cell laminates are designed to encapsulate and protect the fragile voltage-generating component. Generally, a solar cell pre-laminate will incorporate at least two encapsulant layers sandwiched around the solar cell component. (Use of more than one such layer is also described in the art.) The optical properties of the front-sheet encapsulant layer must be such that light can be effectively transmitted to the solar cells. Over the years, a wide variety of polymeric films and sheets have been developed to produce laminated solar cell products. In general, these polymeric films and sheets must possess a combination of characteristics including very high optical clarity, low haze, high impact resistance, shock absorbance, excellent ultraviolet light resistance, good long term thermal stability, excellent adhesion to glass and other solar cell laminate layers, low ultraviolet light transmittance, low moisture absorption, high moisture resistance, excellent long term weatherability, among other requirements. Widely used encapsulant materials include complex, multi-component compositions based on ethylene vinyl acetate (EVA), acid copolymers and ionomers derived therefrom, poly(vinyl acetal) (preferably poly(vinyl butyral) (PVB)), polyurethane (PU), polyvinylchloride (PVC), polyethylene (e.g., metallocene-catalyzed linear low density polyethylene), polyolefin block elastomers, ethylene acrylate ester copolymers (e.g., poly(ethylene-co-methyl acrylate) and poly(ethylene-co-butyl acrylate)), silicone elastomers, epoxy resins, and the like.

Presently when pre-formed poly(vinyl butyral) sheets are used in preparing pre-laminates, highly plasticized poly(vinyl butyral) sheets are used to form the solar cell encapsulant layers. Due to the extreme softness and tackiness at ambient temperature, the use of pre-formed highly plasticized poly(vinyl butyral) sheets as solar cell encapsulant layers has been complicated by the need to refrigerate the highly plasticized poly(vinyl butyral) sheets during shipment and storage. In addition, highly plasticized poly(vinyl butyral) sheets, whose tackiness augments with rising temperature and whose sliding property towards glass gets worse, have a tendency to impair processability and workability. In order to improve the tendency and to suppress the hygroscopicity, the temperature of the working places must be maintained at about 20° C. In practice, when a highly plasticized poly(vinyl butyral) film or sheet is used as the intermediate layer between two sheets of glass, it is necessary to adopt a two-step bonding process to prepare the laminate (See, e.g., EP 0 145 928, page 2, line 30).

There is a need to develop products that overcome these shortcomings and to provide a simplified process for manufacturing solar cell modules.

SUMMARY OF THE INVENTION

The present invention is directed to a solar cell pre-laminate assembly comprising (i) a solar cell component comprising one or a plurality of solar cells and having a light-receiving side and a back side, and (ii) a stiff poly(vinyl butyral) sheet as an encapsulant layer, wherein the stiff poly(vinyl butyral) sheet is positioned next to the light-receiving or the back side of the solar cell component and comprises a poly(vinyl butyral) composition containing about 10 to about 23 wt % of a plasticizer based on the total weight of the composition.

Preferably the poly(vinyl butyral) composition contains about 15 to about 18 wt % of the plasticizer based on the total weight of the composition.

Preferably the stiff poly(vinyl butyral) sheet has a thickness of equal to or less than about 60 mils (1.52 mm). More preferably, the stiff poly(vinyl butyral) sheet has a thickness of about 10 to about 20 mils (about 0.25 to about 0.51 mm).

Preferably the stiff poly(vinyl butyral) sheet has a glass transition temperature (Tg) of about 35° C. to about 60° C., more preferably about 50° C. to about 55° C.

Preferably the plasticizer is selected from the group consisting of triethylene glycol di-2-ethylhexanoate, tetraethylene glycol di-n-heptanoate, dibutyl sebacate, and mixtures thereof.

Preferably the poly(vinyl butyral) used to make the stiff poly(vinyl butyral) sheet has a weight average molecular weight of about 30,000 to about 600,000, and contains about 12 to about 23 wt % of hydroxyl groups calculated as polyvinyl alcohol (PVOH). More preferably the poly(vinyl butyral) used to make the stiff poly(vinyl butyral) sheet has a weight average molecular weight of about 200,000 to 300,000, and contains about 15 to about 19 wt % of hydroxyl groups calculated as polyvinyl alcohol (PVOH).

Preferably the solar cell pre-laminate assembly comprises a second polymeric layer that is positioned next to the solar cell component on the opposite side from the stiff poly(vinyl butyral) sheet, wherein the second polymeric layer comprises a polymeric composition selected from the group consisting of poly(vinyl butyral), ionomers, ethylene vinyl acetate, acoustic poly(vinyl acetal), polyurethane, polyvinylchloride, polyethylenes, polyolefin block elastomers, ethylene acrylate ester copolymers, acid copolymers, silicone elastomers and epoxy resins.

Preferably the stiff poly(vinyl butyral) sheet is positioned next to the light-receiving side of the solar cell component and serves as a front-sheet encapsulant layer and the second polymeric layer is positioned next to the back side of the solar cell component and serves as a second encapsulant layer.

Preferably the second encapsulant layer is formed of a second layer of the stiff poly(vinyl butyral) sheet. The preferences described above with respect to the stiff poly(vinyl butyral) sheet also apply to the second encapsulant layer.

Preferably the solar cell component comprises one or a plurality of solar cells, and the solar cells are preferably selected from the group consisting of multi-crystalline solar cells, thin film solar cells, compound semiconductor solar cells, dye sensitized solar cells, and amorphous silicon solar cells.

Preferably the solar cell pre-laminate assembly comprises an incident layer that is formed of a transparent material and serves as an outer layer at the light-receiving side of the assembly. Preferably the transparent material is glass or a plastic film or sheet.

Preferably the solar cell pre-laminate assembly comprises a back-sheet that serves as an outer layer at the back side of the assembly. Preferably the back-sheet is formed of glass, plastic sheets or films, or metal sheets or films.

In one preferred embodiment, the invention is also directed to a solar cell pre-laminate assembly consisting essentially of, from top to bottom, (i) an incident layer formed of a transparent material, which is positioned next to, (ii) a front-sheet encapsulant layer that is positioned next to, (iii) a solar cell component comprising one or a plurality of solar cells, which is positioned next to, (iv) an optional second encapsulant layer that is positioned next to, (v) a back-sheet, wherein at least one of the two encapsulant layers is formed of a stiff poly(vinyl butyral) sheet that comprises a poly(vinyl butyral) composition containing about 10 to about 23 wt % of a plasticizer, based on the total weight of the composition.

The invention is also directed to a process of manufacturing a solar cell module comprising: (i) providing a solar cell pre-laminate assembly as described above; and (ii) laminating the pre-laminate assembly to form the solar cell module. In a particular embodiment, the step (ii) of lamination is conducted by subjecting the assembly to heat and, optionally, pressure or vacuum.

The invention is further directed to a process of preparing solar cell assembly comprising (i) providing a solar cell component and a stiff poly(vinyl butyral) sheet comprising a poly(vinyl butyral) composition containing about 10 to about 23 wt % of a plasticizer based on the total weight of the poly(vinyl butyral) composition, and (ii) encapsulating the solar cell component in a polymer matrix comprising the poly(vinyl butyral) composition. Preferably the process comprise (a) providing a second interlayer sheet, (b) placing the solar cell component between the stiff poly(vinyl butyral) sheet and the second interlayer sheet to form a pre-laminate, and (c) wherein the encapsulating comprise heating the pre-laminate so that the solar cell component is encapsulated. Preferably the second interlayer sheet is a stiff poly(vinyl butyral) sheet. Preferably the process further comprises forming a solar cell module comprising the encapsulated solar cell component with an incident layer and a back sheet layer. In a particular embodiment, the step (ii) of lamination is conducted by subjecting the assembly to heat and, optionally, pressure or vacuum.

DETAILED DESCRIPTION OF THE INVENTION

Figure 1:
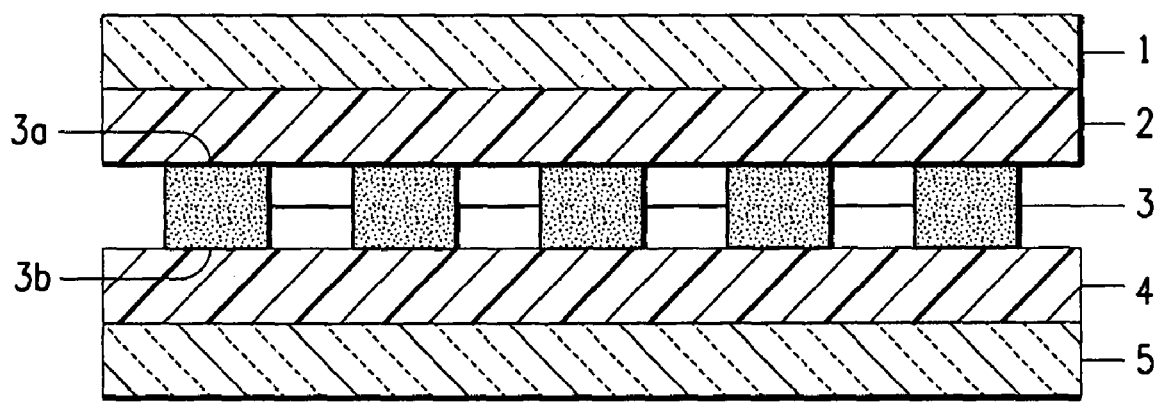
FIG. 1 is a cross-sectional view of a particular embodiment of the present invention, i.e., a solar cell pre-laminate assembly comprising (i) an incident layer 1, (ii) a front encapsulant layer 2, (iii) a solar cell component 3, (iv) a second encapsulant layer 4, and (v) a back-sheet 5, wherein the front encapsulant layer 2 is adjacent to the light-receiving side 3a of the solar cell component 3 and the second encapsulant layer 4 is adjacent to the back side 3b of the solar cell component 3.

All publications, patent applications, patents, and other documents mentioned herein are incorporated by reference in their entirety. Unless otherwise defined, all technical and scientific terms used herein have the same meaning as commonly understood by one of ordinary skill in the art to which this invention belongs. In case of conflict, the present specification, including definitions, will control.

Although methods and materials similar or equivalent to those described herein can be used in the practice or testing of the present invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

When the term "about" is used in describing a value or an end-point of a range, the disclosure should be understood to include the specific value or end-point referred to.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. "A 'consisting essentially of' claim occupies a middle ground between closed claims that are written in a 'consisting of' format and fully open claims that are drafted in a 'comprising' format."

Where applicants have defined an invention or a portion thereof with an open-ended term such as "comprising," it should be readily understood that (unless otherwise stated) the description should be interpreted to also describe such an invention using the terms "consisting essentially of" or "consisting of."

Use of "a" or "an" are employed to describe elements and components of the invention. This is done merely for convenience and to give a general sense of the invention. This description should be read to include one or at least one and the singular also includes the plural unless it is obvious that it is meant otherwise.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers or that amount of the monomers, and the corresponding polymers and compositions thereof.

In describing and/or claiming this invention, the term "copolymer" is used to refer to polymers containing two or more monomers.

The terms "finite amount" and "finite value" are used to refer to an amount that is greater than zero.

For the purpose of the present Application, the terms "poly(vinyl butyral) composition", "poly(vinyl butyral) resin composition", and "plasticized poly(vinyl butyral) composition" are used interchangeably to refer to a composition comprising a finite amount of poly(vinyl butyral) and a finite amount of plasticizer. In addition, the poly(vinyl butyral) composition as defined above may contain a single plasticizer or a mixture of plasticizers. For convenience, however, when describing a poly(vinyl butyral) composition, a mixture of plasticizers can also be referred to herein as "plasticizer". That is, the singular form of the word "plasticizer" as used herein may represent the use of either one plasticizer or the use of a mixture of two or more plasticizers.

The terms "plasticized poly(vinyl butyral) sheet" and "poly(vinyl butyral) sheet" are used interchangeably to refer to a polymeric sheet comprising the poly(vinyl butyral) composition as defined above.

The term "stiff poly(vinyl butyral) sheet" is used to refer to a sheet comprising certain poly(vinyl butyral) composition containing about 10 to about 23 wt % of plasticizer based on the total weight of the composition.

The term "ionomer" is used to refer to a resin composition comprising a neutralized ethylene acid copolymer which comprises copolymerized residues of ethylene and copolymerized residues of $\alpha,\beta$-unsaturated carboxylic acid having from 3 to 8 carbons. The term "acid copolymers" is used to refer to ethylene acid copolymers which comprises copolymerized residues of ethylene and copolymerized residues of $\alpha,\beta$-unsaturated carboxylic acid having from 3 to 8 carbons.

Stiff Poly(Vinyl Butyral) Sheets

The present invention relates to a simplified process for manufacturing solar cell modules, which involves the use of pre-formed stiff poly(vinyl butyral) sheet(s) that are derived from compositions of poly(vinyl butyral) and plasticizer.

Poly(vinyl butyral) is a vinyl resin resulting from the condensation of polyvinyl alcohol with butyraldehyde. The poly(vinyl butyral) used herein may be produced by aqueous or solvent acetalization. In a solvent process, acetalization is carried out in the presence of sufficient solvent to dissolve the poly(vinyl butyral) and produce a homogeneous solution at the end of acetalization. The poly(vinyl butyral) is separated from solution by precipitation of solid particles with water, which are then washed and dried. Solvents used are lower aliphatic alcohols such as ethanol. In an aqueous process, acetalization is carried out by adding butyraldehyde to a water solution of poly(vinyl alcohol) at a temperature of about 20° C. to about 100° C., in the presence of an acid catalyst, agitating the mixture to cause an intermediate poly(vinyl butyral) to precipitate in finely divided form and continuing the agitation while heating until the reaction mixture has proceeded to the desired end point, followed by neutralization of the catalyst, separation, stabilization and drying of the poly(vinyl butyral). For example, poly(vinyl butyral) can be produced as disclosed within U.S. Pat. Nos. 3,153,009 and 4,696,971.

The poly(vinyl butyral) used herein typically have a weight average molecular weight ranging from about 30,000 to about 600,000, or preferably, from about 45,000 to about 300,000, or more preferably, from about 200,000 to 300,000, as measured by size exclusion chromatography using low angle laser light scattering. The poly(vinyl butyral) used herein may comprise about 12 to about 23 wt %, or preferably, about 14 to about 21 wt %, or more preferably about 15 to about 19.5 wt %, or most preferably, about 15 to about 19 wt %, of hydroxyl groups calculated as polyvinyl alcohol (PVOH). The hydroxyl number can be determined according to standard methods, such as ASTM D1396-92 (1998). In addition, preferred poly(vinyl butyral) used herein may include 0 to about 10 %, or more preferably, 0 to about 3 %, of residual ester groups, calculated as polyvinyl ester, typically acetate groups, with the balance being butyraldehyde acetal. The poly(vinyl butyral) used herein may further comprise a minor amount of acetal groups other than butyral, for example, 2-ethyl hexanal, as disclosed within U.S. Pat. No. 5,137,954.

In addition to the poly(vinyl butyral), the poly(vinyl butyral) composition used herein must contain about 10 to about 23 wt % of plasticizer based on the total weight of the composition. The plasticizer provides enhanced flexibility and processability of the poly(vinyl butyral) composition. Suitable plasticizers are commonly known within the art, e.g., as disclosed in U.S. Pat. Nos. 3,841,890; 4,144,217; 4,276,351; 4,335,036; 4,902,464; 5,013,779 and 5,886,075. Plasticizers commonly used are esters of a polybasic acid or a polyhydric alcohol. Preferred plasticizers include, but are not limited to, diesters obtained from the reaction of triethylene glycol or tetraethylene glycol with aliphatic carboxylic acids having from 6 to 10 carbon atoms; diesters obtained from the reaction of sebacic acid with aliphatic alcohols having from 1 to 18 carbon atoms; oligoethylene glycol di-2-ethylhexanoate; tetraethylene glycol di-n-heptanoate; dihexyl adipate; dioctyl adipate; mixtures of heptyl and nonyl adipates; dibutyl sebacate; tributoxyethylphosphate; isodecylphenylphosphate; triisopropylphosphite; polymeric plasticizers, such as, the oil-modified sebacid alkyds; mixtures of phosphates and adipates; mixtures of adipates and alkyl benzyl phthalates; and mixtures thereof. More preferred plasticizers include triethylene glycol di-2-ethylhexanoate, tetraethylene glycol di-n-heptanoate, dibutyl sebacate, and mixtures thereof.

In accordance with the present invention, to provide good processability and a low tendency for the sheet to block under ambient conditions (20-40° C.), the poly(vinyl butyral) compositions used herein should comprise less than about 23 wt %, or preferably, less than about 20 wt %, or more preferably, from about 10 to about 20 wt %, or most preferably, from about 15 to about 18 wt %, of plasticizer based on the total weight of the composition. An example of those preferred poly(vinyl butyral) compositions suitable for use within the present invention is disclosed in US 2005-0192398 A1.

As a consequence of the low plasticizer levels, the poly(vinyl butyral) compositions used herein may require exposure to higher temperatures in order to extrude the and/or to shape the extruded sheet. The higher processing temperatures, however, may allow for undesirable color development. To reduce the color development through processing, the poly(vinyl butyral) compositions used herein may optionally include at least one poly(vinyl butyral) bleaching compound. A poly(vinyl butyral) bleaching compound is any compound that can reduce or eliminate color from the poly(vinyl butyral) sheet relative to the color of an otherwise identical poly(vinyl butyral) sheet without the bleaching compound. The mode of the bleaching action demonstrated by the bleaching compound is not critical to the present invention. For example, a bleaching compound useful in the practice of the present invention can be a compound that reacts directly with color-forming compounds (color bodies) present in a poly(vinyl butyral) composition, or a compound that is capable of yielding a compound that reacts directly with color-bodies. A bleaching compound can be a compound that can decompose in situ to yield decomposition products capable of reacting with color bodies present in a poly(vinyl butyral) composition. A bleaching compound in the practice of the present invention can also be a compound that inhibits the formation of color bodies. Bleaching compounds useful for the present invention include, but are not limited to, inorganic bisulfites such as sodium or potassium bisulfite; organic bisulfites such as tetramethylammonium bisulfite; and compounds that are similar in structure or function. Bleaching compounds also include sulfosuccinates such as dialkyl sulfosuccinates, e.g., sodium dioctylsulfosuccinate.

A bleaching compound can be included in any effective amount. An effective amount for the purposes of the present invention is any amount that reduces the color of a poly(vinyl butyral) sheet relative to the color of an identical or substantially similar poly(vinyl butyral) sheet composition without the bleaching compound. Color measurement can be done according to conventional standard practice. Alternatively, in the absence of comparative data, an effective amount is any amount that reduces the color of a poly(vinyl butyral) sheet to a yellowness index (YID) of less than about 12 YID, or preferably, less than about 10 YID, or more preferably, less than about 8 YID, or most preferably, less than about 6 YID.

The bleaching compound is preferably added during the process of producing the poly(vinyl butyral) composition. The bleaching compound can be included in an amount of about 0.01 to about 0.085 parts per hundred (pph), or preferably, about 0.05 to about 0.80 pph, or more preferably, about 0.10 to about 0.75 pph, based on 100 parts by weight of poly(vinyl butyral) used in the preparation of the composition. While color reduction in the poly(vinyl butyral) sheet is an important consideration, the amount of bleaching compound included therein should also be a function of the cost of production and the other properties that may be affected by including the compound.

An adhesion control additive for, e.g., controlling the adhesive bond between the stiff poly(vinyl butyral) sheets and other component layers in the solar cell modules, may also be used. These are generally alkali metal or alkaline earth metal salts of organic and inorganic acids. Preferably, they are alkali metal or alkaline earth metal salts of organic carboxylic acids having from 2 to 16 carbon atoms. More preferably, they are magnesium or potassium salts of organic carboxylic acids having from 2 to 16 carbon atoms. Specific examples of the adhesion control additives used herein include, e.g., potassium acetate, potassium formate, potassium propanoate, potassium butanoate, potassium pentanoate, potassium hexanoate, potassium 2-ethylbutylate, potassium heptanoate, potassium octanoate, potassium 2-ethylhexanoate, magnesium acetate, magnesium formate, magnesium propanoate, magnesium butanoate, magnesium pentanoate, magnesium hexanoate, magnesium 2-ethylbutylate, magnesium heptanoate, magnesium octanoate, magnesium 2-ethylhexanoate and the like and mixtures thereof. The adhesion control additive is typically used in the range of about 0.001 to about 0.5 wt %, based on the total weight of the poly(vinyl butyral) composition.

Surface tension controlling agents, such as Trans® 290 or Trans® 296 (available from the Trans-Chemco Company, Bristol, Wis.) or Q-23183® (available from The Dow Chemical Company, Midland, Mich.) can also be used in the poly (vinyl butyral) compositions used herein.

The poly(vinyl butyral) compositions used herein may also contain other additives known within the art. The additives may include, but are not limited to, processing aides, flow enhancing additives, lubricants, pigments, dyes, flame retardants, impact modifiers, nucleating agents, anti-blocking agents such as silica, thermal stabilizers, UV absorbers, UV stabilizers, dispersants, surfactants, chelating agents, coupling agents, adhesives, primers, reinforcement additives, such as glass fiber, fillers and the like. Generally, additives that may reduce the optical clarity of the composition, such as reinforcement additives and fillers, are reserved for those sheets used as second encapsulant layers or back-sheets.

Thermal stabilizers can be used and have been widely disclosed within the art. Any known thermal stabilizer may find utility within the present invention. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds that destroy peroxide, hydroxylamines, nitrones, thiosynergists, benzofuranones, indolinones, and the like and mixtures thereof. More preferably, the thermal stabilizer is a bis-phenolic antioxidant, which have been found to be surprisingly suitable for preparing low color poly(vinyl butyral), especially when used in combination with the triethylene glycol di-2-ethylhexanoate plasticizer. Suitable specific bis-phenolic antioxidants include 2,2'-ethylidenebis(4,6-di-t-butylphenol); 4,4'-butylidenebis(2-t-butyl-5-methylphenol); 2,2'-isobutylidenebis(6-t-butyl-4-methylphenol); and 2,2'-methylenebis(6-t-butyl-4-methylphenol). Bis-phenolic antioxidants are commercially available under the tradename of Anox® 29, Lowinox® 22M46, Lowinox® 44B25, and Lowinox® 22IB46, for example. The poly(vinyl butyral) compositions used herein may contain any effective amount of thermal stabilizers. Use of a thermal stabilizer is optional and in some instances is not preferred. When used, the poly(vinyl butyral) compositions contain at least about 0.05 wt %, and up to about 10 wt %, more preferably up to about 5 wt %, and most preferably up to about 1 wt %, of thermal stabilizers, based on the total weight of the composition.

UV absorbers can be used and have also been widely disclosed within the art. Any known UV absorber may find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The poly(vinyl butyral) compositions used herein may contain any effective amount of UV absorbers. Use of a UV absorber is optional and in some instances is not preferred. When used, the poly(vinyl butyral) compositions contain at least about 0.05 wt %, and up to about 10 wt %, more preferably up to about 5 wt %, and most preferably up to about 1 wt %, of UV absorbers, based on the total weight of the composition.

Hindered amine light stabilizers (HALS) can be used and have also been widely disclosed within the art. Generally, Hindered amine light stabilizers are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. The poly (vinyl butyral) compositions used herein may contain any effective amount of hindered amine light stabilizers. Use of hindered amine light stabilizers is optional and in some instances is not preferred. When used, the poly(vinyl butyral) compositions contain at least about 0.05 wt %, and up to about 10 wt %, more preferably up to about 5 wt %, and most preferably, up to about 1 wt %, of hindered amine light stabilizers, based on the total weight of the composition.

The stiff poly(vinyl butyral) sheets used herein are derived from the poly(vinyl butyral) compositions described above, and may be produced through any known process. Generally, the poly(vinyl butyral) sheets are produced through extrusion casting processes. The sheets may have smooth or roughened surfaces. Preferably, the poly(vinyl butyral) sheets used herein have roughened surfaces to facilitate de-airing during the lamination process.

In one particular embodiment, the stiff poly(vinyl butyral) sheets used herein is formed by initially mixing the poly(vinyl butyral) with an appropriate amount of plasticizer and then extruding the composition through a sheet-shaping die, i.e. forcing the molten plasticized poly(vinyl butyral) composition through a horizontally long, vertically narrow die opening substantially conforming in length and width to that of the sheet being formed. The plasticized poly(vinyl butyral) compositions can generally be extruded at a temperature of from about 225° C. to about 245° C. Rough surfaces on one or both sides of the extruding sheet are preferably provided by the design of the die opening and the temperature of the die exit surfaces through which the extrudate passes, as disclosed in, e.g., U.S. Pat. No. 4,281,980. Alternative techniques for producing a preferable rough surface on an extruding poly(vinyl butyral) sheet involve the specification and control of one or more of polymer molecular weight distribution, water content and melt temperature. Sheet formations of poly(vinyl butyral) is disclosed in U.S. Pat. Nos. 2,904,844; 2,909,810; 3,679,788; 3,994,654; 4,161,565; 4,230,771; 4,292,372; 4,297,262; 4,575,540; 5,151,234; 5,886,675 and EP 0 185 863. Alternatively, the as extruded poly(vinyl butyral) sheets may be passed over a specially prepared surface of a die roll positioned in close proximity to the exit of the die which imparts the desired preferable surface characteristics to one side of the molten polymer. Thus, when the surface of such roll has minute peaks and valleys, sheets formed of polymers cast thereon will have a rough surface on the side which contacts the roll which generally conforms respectively to the valleys and peaks of the roll surface. Such die rolls are disclosed in, e.g., U.S. Pat. No. 4,035,549. A roughened sheet surface is preferred to simplify the lamination process and to provide superior solar cell modules. It is understood that such rough surface is only temporary and particularly functions to facilitate de-airing during laminating and after which it is melted smooth from the elevated temperature and pressure associated with autoclaving and other lamination processes.

The thickness of the poly(vinyl butyral) sheets used herein as solar cell encapsulant layers may be equal to or less than about 60 mils (1.52 mm), or preferably, equal to or less than about 30 mils (0.76 mm), or more preferably, equal to or less than about 20 mils (0.51 mm), or most preferably, from about 10 mils (0.25 mm) to about 20 mils (0.51 mm), to provide adequate protection to the solar cell while minimizing the amount of encapsulant utilized. The minimization of the stiff poly(vinyl butyral) sheeting thickness will provide enhanced clarity and light transmission which, in turn, provides enhanced solar cell efficiency.

In addition, the stiff poly(vinyl butyral) sheets used herein may have a glass transition temperature (Tg) of about 35° C. to about 60° C., or, preferably, from about 40° C. to about 57° C., or more preferably, from about 45° C. to about 57° C., or most preferably, from about 50° C. to about 55° C., as measured by Dynamic Mechanical Analysis ASTM D4065 (DMA), using the tangent delta (phase shift at 1 Hz) data as indicator. It is understood that the levels of plasticizer incorporated within the poly(vinyl butyral) compositions play a determining role in the resulting Tg thereof.

A key attribute in using the poly(vinyl butyral) sheets disclosed herein is the reduction and/or elimination of the tendency for the poly(vinyl butyral) sheets to block or stick under ambient conditions, such as in a temperature of about 20° C. to about 40° C., and therefore greatly simplifying the lamination process. For example, unlike conventional, highly plasticized poly(vinyl butyral) sheets, rolls of the stiff poly (vinyl butyral) sheets disclosed herein may be shipped and stored under ambient conditions. Moreover, the commonly used two step lamination process may be avoided.

Solar Cell Pre-Laminate Assemblies

Solar cells are commonly available on an ever increasing variety as the technology evolves and is optimized. Within the present invention, "solar cell component" is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620. Examples of thin film solar cell modules are those that comprise cadmium telluride or CIGS, (Cu(In—Ga)(SeS)2), thin film cells.

The simplified process, as disclosed herein, for manufacturing solar cell modules, which involves the use of the preformed stiff poly(vinyl butyral) sheets disclosed herein, comprises the steps of 1) preparing a solar cell pre-laminate assembly and 2) subjecting the assembly to heat, and frequently under pressure or vacuum, to form the solar cell module.

In accordance to the present invention, the solar cell pre-laminate assembly disclosed herein comprises a solar cell component formed of one or a plurality solar cells and an encapsulant layer that is formed of the stiff poly(vinyl butyral) sheet described above.

In one particular embodiment, the solar cell pre-laminate assembly comprises one layer of the stiff poly(vinyl butyral) sheet that is positioned to one side of the solar cell component and serves as one of the encapsulant layers, or preferably, the stiff poly(vinyl butyral) sheet is positioned to the light-receiving side of the solar cell component and serves as the front-sheet encapsulant layer.

In accordance to the present invention, besides the encapsulant layer formed of the stiff poly(vinyl butyral) sheet, the solar cell pre-laminate assembly may further comprise optionally other encapsulant layers. Such other encapsulant layers may be formed of any suitable films or sheets, which include, but are not limited to, films or sheets comprising poly(vinyl acetal) (e.g., poly(vinyl butyral), including acoustic grades of poly(vinyl butyral)), acid copolymers and ionomers, ethylene vinyl acetate (EVA), polyurethane (PU), poly vinyl chloride (PVC), polyethylenes (e.g., linear low density metallocene-catalyzed polyethylenes), polyolefin block elastomers, ethylene acrylate ester copolymers (e.g., poly(ethylene-co-methyl acrylate) and poly(ethylene-co-butyl acrylate)), silicone elastomers and epoxy resins. Preferred is poly (vinyl butyral).

In a further embodiment, the solar cell pre-laminate assembly disclosed herein comprises two layers of the stiff poly (vinyl butyral) sheet described above, wherein each of the two stiff poly(vinyl butyral) sheets are laminated to each of the two sides of the solar cell component and serve as the front and second encapsulant layers.

The thickness of the individual encapsulant layers other than the stiff poly(vinyl butyral) sheets is not critical and may be independently varied depending on the particular application. Preferably, the thickness of each of these encapsulant layers may independently range from about 1 mil (0.026 mm) to about 120 mils (3.00 mm), or more preferably, from about 1 mil to about 40 mils (1.02 mm), or most preferably, from about 1 mil to about 20 mils (0.51 mm). In addition, all the encapsulant layer(s) comprised in the solar cell laminates, may have smooth or roughened surfaces. Preferably, however, the encapsulant layer(s) have roughened surfaces to facilitate the de-airing of the laminates through the laminate process.

In yet a further embodiment, the solar cell pre-laminate assembly disclosed herein may further comprise an incident layer and/or a back-sheet serving as the outer layers of the assembly at the light-receiving side and the back side, respectively.

The outer layers of the solar cell pre-laminate assemblies, i.e., the incident layers and the back-sheets, may be derived from any suitable sheets or films. Suitable sheets used herein may be glass or plastic sheets, such as, polycarbonate, acrylics, polyacrylate, cyclic polyolefins (e.g., ethylene norbornene polymers), metallocene-catalyzed polystyrene, polyamides, polyesters, fluoropolymers and the like and combinations thereof. In addition, metal sheets, such as aluminum, steel, galvanized steel, or ceramic plates may be utilized in forming the back-sheet.

The term "glass" is meant to include not only window glass, plate glass, silicate glass, "sheet glass", low iron glass, tempered glass, tempered CeO-free glass, and float glass, but also includes colored glass, specialty glass which includes ingredients to control, e.g., solar heating, coated glass with, for example, sputtered metals, such as silver or indium tin oxide, for solar control purposes, E-glass, Toroglass, Solex® glass (a product of Solutia) and the like. Such specialty glasses are disclosed in, e.g., U.S. Pat. Nos. 4,615,989; 5,173, 212; 5,264,286; 6,150,028; 6,340,646; 6,461,736; and 6,468, 934. The type of glass to be selected for a particular laminate depends on the intended use. Of course, it should be readily recognized that glass is referring to sheets of glass. Suitable film layers used herein in the outer or inner layers may be polymeric. Preferred polymers used to form the polymeric films, include but are not limited to, polyesters (e.g., poly (ethylene terephthalate) (PET), poly(ethylene naphthalate), polycarbonate, polyolefins (e.g., polypropylene, polyethylene, and cyclic polyloefins), norbornene polymers, polystyrene (including syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.) cellophane, vinyl chloride polymers (e.g., polyvinylidene chloride, vinylidene chloride copolymers, etc.), fluoropolymers (e.g., polyvinyl fluoride, polyvinylidene fluoride, polytetrafluoroethylene, ethylene-tetrafluoroethylene copolymers, etc.) and the like. Most preferably, the polymeric film is biaxially oriented polyester film (preferably PET film) or a fluoropolymer film (e.g., Tedlar®, Tefzel®, and Teflon® films, from E. I. du Pont de Nemours and Company, Wilmington, Del). Fluoropolymer-polyester-fluoropolymer ("TPT") films are also preferred for some applications. Metal films, such as aluminum foil may also be used herein as the back-sheet.

The solar cell pre-laminate assembly of the present invention, may optionally further comprise other functional film or sheet layers (e.g., dielectric layers or barrier layers) embedded within the assembly. Such functional layers may be derived from any of the above mentioned polymeric films or those that are coated with additional functional coatings. For example, PET films coated with a metal oxide coating, such as those disclosed within U.S. Pat. Nos. 6,521,825; 6,818,819 and EP 1 182 710, may function as oxygen and moisture barrier layers in the laminates.

If desired, a layer of non-woven glass fiber (scrim) may also be included in the solar cell laminates to facilitate de-airing during the lamination process or to serve as reinforcement for the encapsulant layer(s). The use of such scrim layers within solar cell laminates is disclosed within, e.g., U.S. Pat. Nos. 5,583,057; 6,075,202; 6,204,443; 6,320,115; 6,323,416; and EP 0 769 818.

Now referring to FIG. 1, it is shown one particular embodiment of the solar cell pre-laminate assembly of the present invention. In this embodiment, the assembly comprises (i) a solar cell component 3 that is formed of a plurality of electronically interconnected solar cells, (ii) one or more encapsulant layers positioned next to either side of the solar cell component, such as the front encapsulant layer 2 that is positioned next to the light-receiving side 3a of the solar cell component and the second encapsulant layer 4 that is positioned next to the back side 3b of the solar cell component, (iii) a first outer layer on the light-receiving side of the assembly, i.e., the incident layer 1; and (iv) a second outer layer on the rear side of the assembly, i.e., the back-sheet 5. At least one of the two encapsulant layers is a stiff poly(vinyl butyral) sheet.

Also in accordance to the present invention, if greater adhesion is desired, one or both surfaces of any of the layers within the assembly of the present invention may be treated to enhance the adhesion to other layers. This treatment may take any form known within the art, including adhesives, primers (e.g., silanes), flame treatments (see, e.g. U.S. Pat. Nos. 2,632,921; 2,648,097; 2,683,894; and 2,704,382), plasma treatments (see, e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of a polymeric film through vacuum sputtering as disclosed in U.S. Pat. No. 4,865,711. Or, as disclosed in U.S. Pat. No. 5,415,942, a hydroxy-acrylic hydrosol primer coating that may serve as an adhesion-promoting primer for PET films.

In a particular embodiment, the adhesive may take the form of a coating. The thickness of the adhesive/primer coating may be less than 1 mil, or preferably, less than 0.5 mil, or more preferably, less than 0.1 mil. The adhesive may be any adhesive or primer known within the art. Specific examples of adhesives and primers useful in the present invention include, but are not limited to, gamma-chloropropylmethoxysilane, vinyltrichlorosilane, vinyltriethoxysilane, vinyltris(beta-methoxyethoxy)silane, gamma-methacryloxypropyltrimethoxysilane, beta-(3,4-epoxycyclohexyl)ethyltrimethoxysilane, gammaglycidoxypropyltrimethoxysilane, vinyltriacetoxysilane, gamma-mercaptopropyltrimethoxysilane, gamma-aminopropyltriethoxysilane, N-beta-(aminoethyl)-gamma-aminopropyl-trimethoxysilane, glue, gelatin, caesin, starch, cellulose esters, aliphatic polyesters, poly(alkanoates), aliphatic-aromatic polyesters, sulfonated aliphatic-aromatic polyesters, polyamide esters, rosin/polycaprolactone triblock copolymers, rosin/poly(ethylene adipate) triblock copolymers, rosin/poly(ethylene succinate) triblock copolymers, poly(vinyl acetates), poly(ethylene-co-vinyl acetate), poly(ethylene-co-ethyl acrylate), poly(ethylene-co-methyl acrylate), poly(ethylene-co-propylene), poly(ethylene-co-1-butene), poly(ethylene-co-1-pentene), poly(styrene), acrylics, polyurethanes, sulfonated polyester urethane dispersions, nonsulfonated urethane dispersions, urethane-styrene polymer dispersions, non-ionic polyester urethane dispersions, acrylic dispersions, silanated anionic acrylate-styrene polymer dispersions, anionic acrylate-styrene dispersions, anionic acrylate-styrene-acrylonitrile dispersions, acrylate-acrylonitrile dispersions, vinyl chloride-ethylene emulsions, vinylpyrrolidone/styrene copolymer emulsions, carboxylated and noncarboxylated vinyl acetate ethylene dispersions, vinyl acetate homopolymer dispersions, polyvinyl chloride emulsions, polyvinylidene fluoride dispersions, ethylene acrylic acid dispersions, polyamide dispersions, anionic carboxylated or noncarboxylated acrylonitrile-butadiene-styrene emulsions and acrylonitrile emulsions, resin dispersions derived from styrene, resin dispersions derived from aliphatic and/or aromatic hydrocarbons, styrene-maleic anhydrides, and the like and mixtures thereof.

In another particular embodiment, the adhesive or primer is a silane that incorporates an amine function. Specific examples of such materials include, but are not limited to, gamma-aminopropyltriethoxysilane, N-beta-(aminoethyl)-gamma-aminopropyl-trimethoxysilane, and the like and mixtures thereof. Commercial examples of such materials include, e.g., A-1100® silane, (from the Silquest Company, formerly from the Union Carbide Company, believed to be gamma-aminopropyltrimethoxysilane) and Z6020® silane (from the Dow Corning Corp.).

The adhesives may be applied through melt processes or through solution, emulsion, dispersion, and other suitable coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, e.g., U.S. Pat. Nos. 5,078,313; 5,281,446; and 5,456,754.

Notably, specific solar cell pre-laminate assemblies (top (light incident) side to back side) include, but are not limited to:

glass/stiff poly(vinyl butyral) sheet/solar cell/stiff poly(vinyl butyral) sheet/glass;

glass/stiff poly(vinyl butyral) sheet/solar cell/stiff poly(vinyl butyral) sheet/fluoropolymer film (preferably, Tedlar® fluoropolymer film);

fluoropolymer film/stiff poly(vinyl butyral) sheet/solar cell/stiff poly(vinyl butyral) sheet/glass;

fluoropolymer film/stiff poly(vinyl butyral) sheet/solar cell/stiff poly(vinyl butyral) sheet/fluoropolymer film;

glass/stiff poly(vinyl butyral) sheet/solar cell/stiff poly(vinyl butyral) sheet/polyester film;

fluoropolymer film/stiff poly(vinyl butyral) sheet/solar cell/stiff poly(vinyl butyral) sheet/polyester film;

glass/stiff poly(vinyl butyral) sheet/solar cell/stiff poly(vinyl butyral) sheet/barrier coated film/stiff poly(vinyl butyral) sheet/glass;

glass/ionomer encapsulant layer/solar cell/compositionally different encapsulant layer/barrier coated film/stiff poly(vinyl butyral) sheet/fluoropolymer film;

fluoropolymer film/stiff poly(vinyl butyral) sheet/barrier coated film/stiff poly(vinyl butyral) sheet/solar cell/stiff poly(vinyl butyral) sheet/barrier coated film/stiff poly(vinyl butyral) sheet/fluoropolymer film;

glass/stiff poly(vinyl butyral) sheet/solar cell/stiff poly(vinyl butyral) sheet/aluminum stock;

fluoropolymer film/stiff poly(vinyl butyral) sheet/solar cell/stiff poly(vinyl butyral) sheet/aluminum stock;

glass/stiff poly(vinyl butyral) sheet/solar cell/stiff poly(vinyl butyral) sheet/galvanized steel sheet;

glass/stiff poly(vinyl butyral) sheet/solar cell/stiff poly(vinyl butyral) sheet/polyester film/stiff poly(vinyl butyral) sheet/aluminum stock;

fluoropolymer film/stiff poly(vinyl butyral) sheet/solar cell/stiff poly(vinyl butyral) sheet/polyester film/stiff poly(vinyl butyral) sheet/aluminum stock;

glass/stiff poly(vinyl butyral) sheet/solar cell/stiff poly(vinyl butyral) sheet/polyester film/stiff poly(vinyl butyral) sheet/galvanized steel sheet;

fluoropolymer film/stiff poly(vinyl butyral) sheet/solar cell/stiff poly(vinyl butyral) sheet/polyester film/stiff poly(vinyl butyral) sheet/galvanized steel sheet;

glass/stiff poly(vinyl butyral) sheet/solar cell/acoustic poly(vinyl butyral) sheet/glass;

glass/stiff poly(vinyl butyral) sheet/solar cell/poly(vinyl butyral) sheet/fluoropolymer film;

fluoropolymer film/ionomer encapsulant layer/solar cell/stiff poly(vinyl butyral) sheet/glass;

fluoropolymer film/stiff poly(vinyl butyral) sheet/solar cell/acid copolymer encapsulant layer/fluoropolymer film;

glass/stiff poly(vinyl butyral) sheet/solar cell/ethylene vinyl acetate encapsulant layer/polyester film;

fluoropolymer film/stiff poly(vinyl butyral) sheet/solar cell/poly(ethylene-co-methyl acrylate) encapsulant layer/polyester film;

glass/poly(ethylene-co-butyl acrylate) encapsulant layer/solar cell/stiff poly(vinyl butyral) sheet/barrier coated film/poly(ethylene-co-butyl acrylate) encapsulant layer/glass; and the like. The preferred fluoropolymer film in each of the above examples is a Tedlar® fluoropolymer film or a fluoropolymer-polyester-flurorpolymer (TPT) trilayer film. The preferred polyester film in each of the above examples is a PET film. The term "glass" is intended to refer to sheets of any of the aforementioned types of glass or glass alternatives.

Manufacture of Solar Cell Modules or Laminates

In the present process for manufacturing solar cell laminates or modules, unlike those other process wherein poly(vinyl butyral) resin powder or hot melt or conventional highly plasticized poly(vinyl butyral) sheets are used to encapsulate the solar cell(s), the stiff poly(vinyl butyral) sheets disclosed herein can be simply laid up with the solar cell(s) and other functional layers and subject to further lamination process, as described below.

In accordance to the present invention, the lamination process may be an autoclave or non-autoclave process. For example, the solar cell pre-laminate assembly described above may be laid up in a vacuum lamination press and laminated together under vacuum with heat and standard atmospheric or elevated pressure In an exemplary process, a glass sheet, a front-sheet encapsulant layer, a solar cell, a second encapsulant layer and backsheet (e.g., Tedlar® film), and a cover glass sheet are laid up and laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the pre-laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of about 150-250, preferably about 200 psi (about 15 bars), for from about 10 to about 50 minutes. Preferably the bag is autoclaved at a temperature of from about 120° C. to about 160° C. for about 20 to about 45 minutes. More preferably the bag is autoclaved at a temperature of from about 135° C. to about 160° C. for about 20 to about 40 minutes. A vacuum ring may be substituted for the vacuum bag. One type of vacuum bags is disclosed within U.S. Pat. No. 3,311,517.

Any air trapped within the pre-laminate assembly may be removed through a nip roll process. For example, the pre-laminate assembly may be heated in an oven at a temperature of about 80° C. to about 120° C., or preferably, at a temperature of between about 90° C. and about 100° C., for about 15-60 (preferably about 30) minutes. Thereafter, the heated pre-laminate assembly is passed through a set of nip rolls so that the air in the void spaces between the solar cell outside layers, the solar cell(s) and the encapsulant layers may be squeezed out, and the edge of the assembly sealed. This process may provide the final solar cell module or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and pressure to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 10-30 (preferably about 20) minutes of cooling, the excess air pressure is vented and the solar cell laminates are removed from the autoclave. This should not be considered limiting. Essentially any lamination process known within the art may be used herein.

A non-autoclave lamination process has been disclosed, e.g., within U.S. Pat. Nos. 3,234,062; 3,852,136; 4,341,576; 4,385,951; 4,398,979; 5,536,347; 5,853,516; 6,342,116; 5,415,909; US 2004-0182493; US 2003-0148114 A1; EP 1 235 683 B1; WO 91/01880 and WO 03/057478 A1. Generally, the non-autoclave process includes heating the pre-laminate assembly or the pre-press assembly and, optionally, the application of vacuum, pressure or both. For example, the pre-press may be successively passed through heating ovens and nip rolls.

If desired, the edges of the solar cell module or laminate may be sealed to reduce moisture and air intrusion and the potential degradation effect on the efficiency and lifetime of the solar cell(s) by any means disclosed within the art. Suitable edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples are intended to be illustrative of the present invention, and are not intended in any way to limit the scope of the present invention. The solar cell interconnections are omitted from the examples below to clarify the structures, but any common art solar cell interconnections may be utilized within the present invention.

Methods

The following methods are used in the Examples presented hereafter.

I. Lamination Process 1:

The laminate layers described below are stacked (laid up) to form the pre-laminate assembly described within the examples. For the assembly containing a film layer as the incident or back-sheet layer, a cover glass sheet is placed over the film layer. The pre-laminate assembly is then placed within a vacuum bag, the vacuum bag is sealed and a vacuum is applied to remove the air from the vacuum bag. The bag is placed into an oven and while maintaining the application of the vacuum to the vacuum bag, the vacuum bag is heated at 135° C. for 30 minutes. The vacuum bag is then removed from the oven and allowed to cool to room temperature (25±5° C.). The laminate is then removed from the vacuum bag after the vacuum is discontinued.

II. Lamination Process 2:

The laminate layers described below are stacked (laid up) to form the pre-laminate assemblies described within the examples. For the assembly containing a film layer as the incident or back-sheet layer, a cover glass sheet is placed over the film layer. The pre-laminate assembly is then placed within a vacuum bag, the vacuum bag is sealed and a vacuum is applied to remove the air from the vacuum bag. The bag is placed into an oven and heated to 90-100° C. for 30 minutes to remove any air contained between the assembly. The pre-press assembly is then subjected to autoclaving at 135° C. for 30 minutes in an air autoclave to a pressure of 200 psig (14.3 bar), as described above. The air is then cooled while no more air is added to the autoclave. After 20 minutes of cooling when the air temperature reaches less than about 50° C., the excess pressure is vented, and the laminate is removed from the autoclave.

Examples 1-14

The 12-inch by 12-inch solar cell pre-laminate assemblies described below in Table 1 are assembled and laminated by Lamination Process 1. In each assembly, the layers are described in the order of from top (i.e., the incident layer) to bottom (i.e., the back-sheet).

TABLE 1

Solar Cell Laminate Structures

| Example | Layer 1 | Layer 2 | Layer 3 | Layer 4 | Layer 5 |
|---|---|---|---|---|---|
| 1, 15 | Glass 1 | PVB S1 | Solar Cell 1 | PVB S1 | Glass 1 |
| 2, 16 | Glass 2 | PVB S2 | Solar Cell 2 | PVB S2 | Glass 2 |
| 3, 17 | Glass 1 | PVB S3 | Solar Cell 3 | PVB S3 | Glass 2 |
| 4, 18 | Glass 1 | PVB S1 | Solar Cell 4 | PVB S1 | Glass 2 |
| 5, 19 | FPF | PVB S3 | Solar Cell 1 | PVB S3 | FPF |
| 6, 20 | Glass 1 | PVB S2 | Solar Cell 1 | Ionomer 1 | Glass 3 |
| 7, 21 | FPF | PVB S1 | Solar Cell 4 | EBA | AL |
| 8, 22 | Glass 1 | PVB S3 | Solar Cell 1 | ACR | AL |
| 9, 23 | Glass 2 | Ionomer 2 | Solar Cell 4 | PVB S1 | AL |
| 10, 24 | FPF | PVB S2 | Solar Cell 1 | PVB A | Glass 2 |
| 11, 25 | FPF | PVB S3 | Solar Cell 4 | EMA | FPF |
| 12, 26 | Glass 1 | PVB S1 | Solar Cell 1 | PVB S1 | AL |
| 13, 27 | Glass 1 | PVB S3 | Solar Cell 2 | EVA | Glass 1 |
| 14, 28 | Glass 2 | PVB S1 | Solar Cell 1 | PVB | Glass |

ACR is a 20 mil (0.51 mm) thick embossed sheet of a poly(ethylene-co-methacrylic acid) containing 15 wt % of polymerized residues of methacrylic acid and having a MI of 5.0 g/10 minutes (190° C., ISO 1133, ASTM D1238).

AL is an aluminum sheet (3.2 mm thick) that is 5052 alloyed with 2.5 wt % of magnesium and conforms to Federal specification QQ-A-250/8 and ASTM B209.

EBA is a formulated composition based on poly(ethylene-co-butyl acrylate) containing 20 wt % of polymerized residues of butyl acrylate based on the total weight of the copolymer in the form of a 20 mil (0.51 mm) thick sheet.

EMA is a formulated composition based on poly(ethylene-co-methyl acrylate) containing 20 wt % of polymerized residues of methyl acrylate based on the total weight of the copolymer in the form of a 20 mil (0.51 mm) thick sheet.

EVA is SC50B, believed to be a formulated composition based on poly(ethylene-co-vinyl acetate) in the form of a 20 mil (0.51 mm) thick sheet (a product of the Hi-Sheet Corporation, formerly Mitsui Chemicals Fabro, Inc.).

FPF is a corona surface treated Tedlar® film (1.5 mil (0.038 mm) thick), a product of E. I. du Pont de Nemours and Company, Wilmington, Del.

Glass 1 is Starphire® glass from the PPG Corporation.

Glass 2 is a clear annealed float glass plate layer (2.5 mm thick).

Glass 3 in a Solex® solar control glass (3.0 mm thick).

Ionomer 1 is a 90 mil (2.25 mm) thick embossed sheet of a poly(ethylene-co-methacrylic acid) containing 18 wt % of polymerized residues of methacrylic acid that is 30% neutralized with zinc ion and having a MI of 1 g/10 minutes (190° C., ISO 1133, ASTM D1238). Ionomer 1 is prepared from a poly(ethylene-co-methacrylic acid) having a MI of 60 g/10 minutes.

Ionomer 2 is a 20 mil (0.51 mm) thick embossed sheet of a poly(ethylene-co-methacrylic acid) containing 22 wt % of polymerized residues of methacrylic acid that is 26% neutralized with zinc ion and having a MI of 0.75 g/10 minutes (190° C., ISO 1133, ASTM D1238). Ionomer 2 is prepared from a poly(ethylene-co-methacrylic acid) having a MI of 60 g/10 minutes.

PVB is B51V, believed to be a formulated composition based on poly(vinyl butyral) in the form of a 20 mil (0.51 mm) thick sheet (a product of E. I. du Pont de Nemours and Company, Wilmington, Del.).

PVB A is an acoustic poly(vinyl butyral) sheet containing 100 parts per hundred (pph) poly(vinyl butyral) with a hydroxyl number of 15 and plasticized with 48.5 pph plasticizer tetraethylene glycol diheptanoate prepared similarly to those disclosed within US 2006-0008648 A1.

PVB S1 is a 20 mil (0.51 mm) thick stiff poly(vinyl butyral) sheet prepared similarly to that disclosed in Example 2 of US 2005-0192398 A1.

PVB S2 is a 30 mil (0.76 mm) thick stiff poly(vinyl butyral) sheet prepared similarly to that disclosed in Example 3 of US 2005-0192398 A1.

PVB S3 is a 15 mil (0.38 mm) thick stiff poly(vinyl butyral) sheet prepared similarly to that disclosed in Example 3 of US 2005-0192398 A1.

Solar Cell 1 is a 10-inch by 10-inch amorphous silicon photovoltaic device comprising a stainless steel substrate (125 micrometers thick) with an amorphous silicon semiconductor layer (see, e.g., Example 1 of U.S. Pat. No. 6,093,581).

Solar Cell 2 is a 10-inch by 10-inch copper indium diselenide (CIS) photovoltaic device (see, e.g., column 6, line 19 of U.S. Pat. No. 6,353,042).

Solar Cell 3 is a 10-inch by 10-inch cadmium telluride (CdTe) photovoltaic device (see, e.g., column 6, line 19 of U.S. Pat. No. 6,353,042).

Solar Cell 4 is a silicon solar cell made from a 10-inch by 10-inch polycrystalline EFG-grown wafer (see, e.g., column 7, line 61 of U.S. Pat. No. 6,660,930).

Examples 15-28

The 12-inch by 12-inch solar cell pre-laminate assemblies described above in Table 1 are assembled and laminated by Lamination Process 2. In each assembly, the layers are described in the order of from top (i.e., the incident layer) to bottom (i.e., the back-sheet).

What is claimed is:

1. A solar cell pre-laminate assembly comprising (i) a solar cell component comprising one or a plurality of solar cells and having a light-receiving side and a back side, and (ii) stiff poly(vinyl butyral) sheet as an encapsulant layer, wherein the stiff poly(vinyl butyral) sheet has a glass transition temperature (Tg) of about 40° C. to about 60° C., is positioned next to the light-receiving or the back side of the solar cell component and comprises a poly(vinyl butyral) composition consisting essentially of (a) poly(vinyl butyral), (b) about 10 to about 18 wt % of a plasticizer, based on the total weight of the composition, and (c) optionally one or more additives selected from the group consisting of bleaching compounds, adhesion control additives, surface tension controlling agents, processing aides, flow enhancing additives, lubricants, pigments, dyes, flame retardants, impact modifiers, nucleating agents, anti-blocking agents, thermal stabilizers, UV absorbers, UV stabilizers, dispersants, surfactants, chelating agents, adhesives, primers, reinforcement additives and fillers.

2. The solar cell pre-laminate assembly of claim 1, wherein the poly(vinyl butyral) composition has about 15 to about 18 wt % of the plasticizer based on the total weight of the composition.

3. The solar cell pre-laminate assembly of claim 1, wherein the stiff poly(vinyl butyral) sheet has a thickness of equal to or less than about 60 mils.

4. The solar cell pre-laminate assembly of claim 2, wherein the stiff poly(vinyl butyral) sheet has a thickness of about 10 to about 20 mils.

5. The solar cell pre-laminate assembly of claim 1, wherein the stiff poly(vinyl butyral) sheet has a glass transition temperature (Tg) of about 45° C. to about 57° C.

6. The solar cell pre-laminate assembly of claim 4, wherein the stiff poly(vinyl butyral) sheet has a glass transition temperature (Tg) of about 50° C. to about 55° C.

7. The solar cell pre-laminate assembly of claim 1 wherein the plasticizer is selected from the group consisting of triethylene glycol di-2-ethylhexanoate, tetraethylene glycol di-n-heptanoate, dibutyl sebacate, and mixtures thereof.

8. The solar cell pre-laminate assembly of claim 6, wherein the poly(vinyl butyral) used to make the stiff poly(vinyl butyral) sheet has a weight average molecular weight of about 30,000 to about 600,000, and has about 12 to about 23 wt % of hydroxyl groups calculated as polyvinyl alcohol.

9. The solar cell pre-laminate assembly of claim 6, wherein the poly(vinyl butyral) used to make the stiff poly(vinyl butyral) sheet has a weight average molecular weight of about 200,000 to about 300,000, and has about 15 to about 19 wt % of hydroxyl groups calculated as polyvinyl alcohol, and wherein the plasticizer is selected from the group consisting of triethylene glycol di-2-ethylhexanoate, tetraethylene glycol di-n-heptanoate, dibutyl sebacate, and mixtures thereof.

10. The solar cell pre-laminate assembly of claim 1, further comprising a second polymeric layer that is positioned next to the solar cell component on the opposite side from the stiff poly(vinyl butyral) sheet, wherein the second polymeric layer comprises a polymeric composition selected from the group consisting of poly(vinyl butyral), ionomers, ethylene vinyl acetate, acoustic poly(vinyl acetal), polyurethane, polyvinylchloride, polyethylenes, polyolefin block elastomers, ethylene acrylate ester copolymers, acid copolymers, silicone elastomers and epoxy resins.

11. The solar cell pre-laminate assembly of claim 10, wherein the stiff poly(vinyl butyral) sheet is positioned next to the light-receiving side of the solar cell component and serves as a front-sheet encapsulant layer and the second polymeric layer is positioned next to the back side of the solar cell component and serves as a second encapsulant layer.

12. The solar cell pre-laminate assembly of claim 11, wherein the second encapsulant layer is formed of a second layer of the stiff poly(vinyl butyral) sheet and the stiff poly (vinyl butyral) sheets have a glass transition temperature (Tg) of about 45° C. to about 57° C.

13. The solar cell pre-laminate assembly of claim 1, wherein the one or a plurality of solar cells are selected from the group consisting of multi-crystalline solar cells, thin film solar cells, compound semiconductor solar cells, dye sensitized solar cells, and amorphous silicon solar cells.

14. The solar cell pre-laminate assembly of claim 1, further comprising an incident layer that is formed of a transparent material and serves as an outer layer at the light-receiving side of the assembly.

15. The solar cell pre-laminate assembly of claim 14, wherein the transparent material is glass or a plastic film or sheet.

16. The solar cell pre-laminate assembly of claim 1, further comprising a back-sheet that serves as an outer layer at the back side of the assembly.

17. The solar cell pre-laminate assembly of claim 16, wherein the back-sheet is formed of glass, plastic sheets or films, or metal sheets or films.

18. The solar cell pre-laminate assembly of claim 12, wherein (a) the poly(vinyl butyral) composition has about 15 to about 18 wt % of the plasticizer based on the total weight of the composition; (b) each of the two stiff poly(vinyl butyral) sheets has a thickness of about 10 to about 20 mils; (c) each of the two stiff poly(vinyl butyral) sheets has a glass transition temperature (Tg) of about 50° C. to about 55° C.;

(d) the poly(vinyl butyral) used to make the two stiff poly (vinyl butyral) sheet has a weight average molecular weight of about 200,000 to 300,000, and has about 15 to about 19 wt % of hydroxyl groups calculated as polyvinyl alcohol, and (e) the plasticizer is selected from the group consisting of triethylene glycol di-2-ethylhexanoate, tetraethylene glycol di-n-heptanoate, dibutyl sebacate, and mixtures thereof.

19. A solar cell pre-laminate assembly consisting essentially of, from top to bottom, (i) an incident layer formed of a transparent material, which is positioned next to, (ii) a front-sheet encapsulant layer that is positioned next to, (iii) a solar cell component comprising one or a plurality of solar cells, which is positioned next to, (iv) an optional second encapsulant layer that is positioned next to, (v) a back-sheet, wherein at least one of the two encapsulant layers is formed of a stiff poly(vinyl butyral) sheet having a glass transition temperature (Tg) of about 40° C. to about 60° C. that comprises a poly(vinyl butyral) composition consisting essentially of (a) poly(vinyl butyral), (b) about 15 to about 18 wt % of a plasticizer, based on the total weight of the composition, and (c) optionally one or more additives selected from the group consisting of bleaching compounds, adhesion control additives, surface tension controlling agents, processing aides, flow enhancing additives, lubricants, pigments, dyes, flame retardants, impact modifiers, nucleating agents, anti-blocking agents, thermal stabilizers, UV absorbers, UV stabilizers, dispersants, surfactants, chelating agents, adhesives, primers, reinforcement additives and fillers.

20. The solar cell pre-laminate assembly of claim 19, wherein (a) the stiff poly(vinyl butyral) sheet has a thickness of about 10 to about 20 mils; (b) the stiff poly(vinyl butyral) sheet has a glass transition temperature (Tg) of about 50° C. to about 55° C.; (c) the poly(vinyl butyral) used to make the stiff poly(vinyl butyral) sheet has a weight average molecular weight of about 200,000 to 300,000, and has about 15 to about 19 wt % of hydroxyl groups calculated as polyvinyl alcohol, and (d) the plasticizer is selected from the group consisting of triethylene glycol di-2-ethylhexanoate, tetraethylene glycol di-n-heptanoate, dibutyl sebacate, and mixtures thereof.

21. A process of manufacturing a solar cell module comprising: (i) providing a solar cell pre-laminate assembly as described in claim 1; and (ii) laminating the pre-laminate assembly to form the solar cell module.

22. A process of manufacturing a solar cell module comprising: (i) providing a solar cell pre-laminate assembly as described in claim 20; and (ii) laminating the pre-laminate assembly to form the solar cell module.

23. The process of claim 21, wherein the step (ii) of lamination is conducted by subjecting the assembly to heat.

24. The process of claim 23, wherein the step (ii) of lamination further comprising subjecting the assembly to vacuum.

25. A process of preparing solar cell assembly comprising (i) providing a solar cell component and a stiff poly(vinyl butyral) sheet having a glass transition temperature (Tg) of about 40° C. to about 60° C. comprising a poly(vinyl butyral) composition consisting essentially of (a) poly(vinyl butyral), (b) about 10 to about 18 wt % of a plasticizer, based on the total weight of the poly(vinyl butyral) composition, and (c) optionally one or more additives selected from the group consisting of bleaching compounds, adhesion control additives, surface tension controlling agents, processing aides, flow enhancing additives, lubricants, pigments, dyes, flame retardants, impact modifiers, nucleating agents, anti-blocking agents, thermal stabilizers, UV absorbers, UV stabilizers, dispersants, surfactants, chelating agents, adhesives, primers, reinforcement additives and fillers, and (ii) encapsulating the solar cell component in a polymer matrix comprising the poly(vinyl butyral) composition.

26. The process of claim 25 comprising (a) providing a second interlayer sheet, (b) placing the solar cell component between the stiff poly(vinyl butyral) sheet and the second interlayer sheet to form a pre-laminate, and (c) wherein the encapsulating comprise heating the pre-laminate so that the solar cell component is encapsulated.

27. The process of claim 26 wherein the second interlayer sheet is a stiff poly(vinyl butyral) sheet having a glass transition temperature (Tg) of about 40° C. to about 60° C.

28. The process of claim 25 further comprising forming a solar cell module comprising the encapsulated solar cell component with an incident layer and a back sheet layer, and wherein (a) the poly(vinyl butyral) composition has about 15 to about 18 wt % of the plasticizer based on the total weight of the composition; (b) the stiff poly(vinyl butyral) sheet has a thickness of about 10 to about 20 mils; (c) the stiff poly(vinyl butyral) sheet has a glass transition temperature (Tg) of about 50° C. to about 55° C.; (d) the poly(vinyl butyral) used to make the stiff poly(vinyl butyral) sheet has a weight average molecular weight of about 200,000 to 300,000, and has about 15 to about 19 wt % of hydroxyl groups calculated as polyvinyl alcohol, and (e) the plasticizer is selected from the group consisting of triethylene glycol di-2-ethylhexanoate, tetraethylene glycol di-n-heptanoate, dibutyl sebacate, and mixtures thereof.

29. A solar cell pre-laminate assembly comprising (i) a solar cell component comprising one or a plurality of solar cells and having a light-receiving side and a back side, and (ii) stiff poly(vinyl butyral) sheet as an encapsulant layer, wherein the stiff poly(vinyl butyral) sheet has a glass transition temperature (Tg) of about 40° C. to about 60° C., is positioned next to the light-receiving or the back side of the solar cell component and comprises a poly(vinyl butyral) composition consisting of (a) poly(vinyl butyral), (b) about 10 to about 18 wt % of a plasticizer, based on the total weight of the composition, and (c) optionally one or more additives selected from the group consisting of bleaching compounds, adhesion control additives, surface tension controlling agents, processing aides, flow enhancing additives, lubricants, pigments, dyes, flame retardants, impact modifiers, nucleating agents, anti-blocking agents, thermal stabilizers, UV absorbers, UV stabilizers, dispersants, surfactants, chelating agents, adhesives, primers, reinforcement additives and fillers.

* * * * *